(12) United States Patent
Liu et al.

(10) Patent No.: US 11,125,826 B2
(45) Date of Patent: Sep. 21, 2021

(54) BATTERY IMPEDANCE MEASUREMENT

(71) Applicant: Apple Inc., Cupertino, CA (US)

(72) Inventors: Qing Liu, Mountain View, CA (US); Eric G. Smith, Palo Alto, CA (US)

(73) Assignee: Apple Inc., Cupertino, CA (US)

( * ) Notice: Subject to any disclaimer, the term of this patent is extended or adjusted under 35 U.S.C. 154(b) by 161 days.

(21) Appl. No.: 16/414,958

(22) Filed: May 17, 2019

(65) Prior Publication Data

US 2020/0363476 A1 Nov. 19, 2020

(51) Int. Cl.
*G01R 31/389* (2019.01)
*H02J 7/00* (2006.01)

(52) U.S. Cl.
CPC .............. *G01R 31/389* (2019.01); *H02J 7/00* (2013.01)

(58) Field of Classification Search
None
See application file for complete search history.

(56) References Cited

U.S. PATENT DOCUMENTS

| | | | | |
|---|---|---|---|---|
| 5,666,040 A | * | 9/1997 | Bourbeau | H01M 10/48 320/118 |
| 5,986,434 A | * | 11/1999 | Roy | H02J 7/0091 320/128 |
| 10,345,384 B2 | * | 7/2019 | Christophersen | G01R 31/389 |
| 2001/0011880 A1 | * | 8/2001 | James | H02M 1/4208 320/104 |
| 2011/0068746 A1 | * | 3/2011 | Rocci | H02J 13/00028 320/118 |
| 2013/0088081 A1 | * | 4/2013 | Siri | H02J 3/381 307/46 |
| 2015/0333553 A1 | * | 11/2015 | Huang | H02J 7/0068 320/138 |
| 2016/0006272 A1 | * | 1/2016 | Greening | H02J 7/00047 320/162 |
| 2016/0268829 A1 | * | 9/2016 | Huang | H02J 7/0068 |
| 2021/0126471 A1 | * | 4/2021 | Srivastava | H02J 7/0016 |

* cited by examiner

*Primary Examiner* — Jermele M Hollington
(74) *Attorney, Agent, or Firm* — Blank Rome LLP

(57) ABSTRACT

An electronic device can include a battery, a battery charger configured to receive power from an external power source and supply at least one of a charging current or a charging voltage to the battery, and a battery charger controller coupled to charger and configured to control the battery charger. More specifically, the battery charger controller may be configured to control the charger to supply a first AC signal as at least a part of the charging current or charging voltage supplied to the battery, measure a second AC signal associated with the first AC signal, and determine an impedance of the battery at a frequency of interest from the first and second AC signals. The electronic device can also or alternatively include a variable load that may be controlled to supply a first AC signal as at least part of the discharging current or discharging voltage of the battery.

22 Claims, 5 Drawing Sheets

BATTERY IMPEDANCE MEASUREMENT

BACKGROUND

People are becoming increasingly reliant on portable electronic and computing devices (hereinafter "portable electronic devices") such as smart phones, smart watches, tablet computers, and laptop computers to meet a variety of their communication and computing needs. Such portable devices rely on battery power for their portability. As a battery ages, charges, discharges, and/or experiences varying temperatures, its internal impedance changes. These internal impedance changes may impact the battery's ability to supply large current transients. In some cases, a large current demand from an aged, cold, and/or low state of charge ("SoC") battery can cause the voltage seen by the portable electronic device to drop below a level that triggers a brown-out or reset of the device.

Because these brown-outs or resets negatively impact the user, portable electronic device makers implement power control systems into these devices that prevent such conditions. Such control systems may benefit, both in the design and operation phases, from detailed knowledge about battery impedance. While impedance measurements made in laboratory conditions are useful, battery impedance measurements made in "real world" conditions may be even more useful. Thus, what is needed in the art are methods and apparatuses that allow for improved battery impedance measurements during operation (i.e., charging and/or discharging) of the battery.

SUMMARY

An electronic device can include a battery, a battery charger configured to receive power from an external power source and supply at least one of a charging current or a charging voltage to the battery, and a battery charger controller coupled to charger and configured to control the battery charger. More specifically, the battery charger controller may be configured to control the charger to generate a first AC signal supplied as at least part of the charging current or charging voltage supplied to the battery. The controller may further be configured to measure a second AC signal associated with the first AC signal and determine an impedance of the battery at a frequency of interest from the first and second AC signals.

The first AC signal can be an AC current superimposed on the charging current or charging voltage, and the second AC signal can be an AC voltage. The AC current may be a sinusoidal current signal, including, for example, a variable frequency chirp. The first AC signal may also or alternatively be an AC voltage, and the second AC signal may be an AC current.

Alternatively or additionally, the AC signal may be generated by turning the battery charger on and off at a frequency of interest. In any case, the battery charger controller may be controlled by a processing subsystem of the electronic device. The battery charger controller may alternatively or additionally be integrated with a processing subsystem of the electronic device.

A method of determining impedance of a battery of an electronic device during operation of the electronic device can include operating a component of the electronic device to generate a first AC signal as at least part of a battery current or a battery voltage of the electronic device, monitoring a second AC signal associated with the first AC signal, and determining an impedance of the battery at a frequency of interest from the first and second AC signals. Operating a component of the electronic device to generate a first AC signal as at least part of a battery current or a battery voltage of the electronic device can include operating a battery charger to superimpose an AC current on the charging current or voltage supplied to the battery. In such a case, the second AC signal may be an AC voltage. The AC current may be a sinusoidal current signal, such as a variable frequency chirp. Operating a component of the electronic device to generate a first AC signal as at least part of a battery current or a battery voltage can also or alternatively include turning a battery charger on and off at a frequency of interest.

Alternatively (or additionally), operating a component of the electronic device to generate a first AC signal as at least part of a battery current or a battery voltage of the electronic device can include operating a subsystem of the electronic device so as to present a variable load to the battery during discharge of the battery. For example, an operating frequency of a processing subsystem of the electronic device may be varied at a frequency of interest.

An electronic device can include a battery, means for generating a first AC signal as at least part of a battery current or a battery voltage, means for monitoring a second AC signal associated with the first AC signal, and means for determining an impedance of the battery at a frequency of interest from the first and second AC signals. The means for generating a first AC signal as at least part of a battery current or a battery voltage can include a battery charger having at least one of a controllable voltage source and a controllable current source, and a battery charger controller coupled to the battery charger and configured to control the at least one of a controllable voltage source and a controllable current source. The means for generating a first AC signal as at least part of a battery current or a battery voltage can alternatively or additionally include a subsystem of the electronic device operable to present a variable load to the battery during discharge of the battery. The subsystem of the electronic device operable to present a variable load to the battery during discharge of the battery can include a processing subsystem of the electronic device having its operating frequency varied at a frequency of interest.

The means for monitoring a second AC signal associated with the first AC signal can include at least one of a current sensor or a voltage signal AC coupled to the battery. Alternatively or additionally, the means for monitoring a second AC signal associated with the first AC signal can include a processing configured to isolate an AC component of at least one of the battery voltage or battery current.

DETAILED DESCRIPTION

Figure 1:
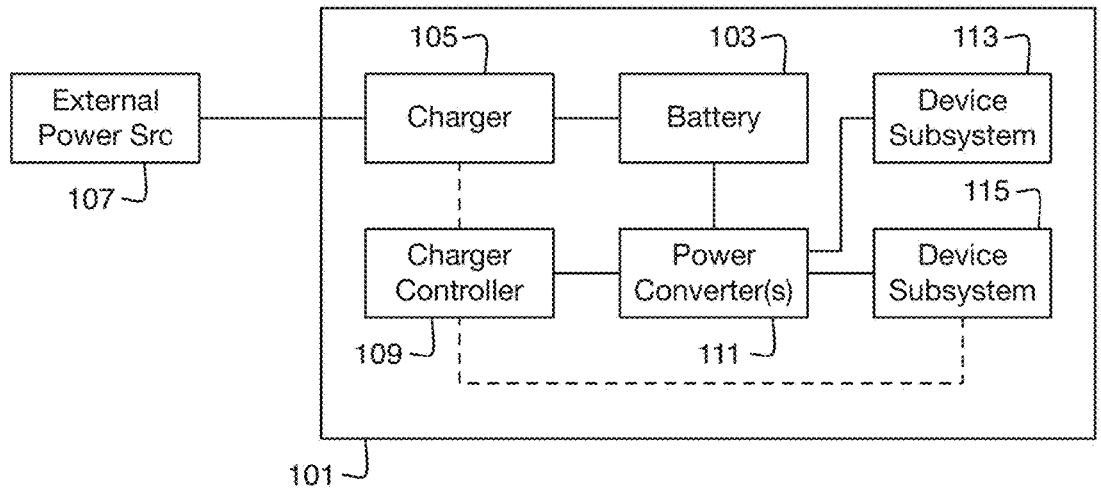
FIG. 1 depicts a block diagram of an electronic device including systems for charging a battery and determining an impedance of the battery in operation.

In the following description, for purposes of explanation, numerous specific details are set forth to provide a thorough understanding of the disclosed concepts. As part of this description, some of this disclosure's drawings represent structures and devices in block diagram form for sake of simplicity. In the interest of clarity, not all features of an actual implementation are described in this disclosure. Moreover, the language used in this disclosure has been selected for readability and instructional purposes, has not been selected to delineate or circumscribe the disclosed subject matter. Rather the appended claims are intended for such purpose.

Various embodiments of the disclosed concepts are illustrated by way of example and not by way of limitation in the accompanying drawings in which like references indicate similar elements. For simplicity and clarity of illustration, where appropriate, reference numerals have been repeated among the different figures to indicate corresponding or analogous elements. In addition, numerous specific details are set forth in order to provide a thorough understanding of the implementations described herein. In other instances, methods, procedures and components have not been described in detail so as not to obscure the related relevant function being described. References to "an," "one," or "another" embodiment in this disclosure are not necessarily to the same or different embodiment, and they mean at least one. A given figure may be used to illustrate the features of more than one embodiment, or more than one species of the disclosure, and not all elements in the figure may be required for a given embodiment or species. A reference number, when provided in a given drawing, refers to the same element throughout the several drawings, though it may not be repeated in every drawing. The drawings are not to scale unless otherwise indicated, and the proportions of certain parts may be exaggerated to better illustrate details and features of the present disclosure.

FIG. 1 illustrates a block diagram of a system including a battery powered portable electronic device 101. In FIG. 1, solid connections between modules illustrate power flow, while dashed connections between modules indicate control and/or data flow. Portable electronic device 101 may be, for example, a portable computer, such as a laptop or tablet computer, a smart phone or other personal digital assistant type device, or a wearable device, such as a smart watch. The principles disclosed herein may also be applied to battery powered devices that are not necessarily portable, such as uninterruptible power supplies or other types of backup power systems. In general, portable electronic device 101 may include one or more device subsystems 113, 115, that are powered by a battery 103. Depending on the specific device type and configuration, the device subsystems may include things like processing subsystems, display subsystems, communications subsystems, input/output subsystems, etc. In general the device subsystems 113, 115 may be powered by one or more power converter(s) 111. These power converters may be any of a variety of types of switching power supplies, which typically include one or more switching devices and one or more energy storage elements, such as inductors or capacitors. Power converter(s) 111 may be buck converters, boost converters, buck-boost converters, resonant converters, bidirectional converters, etc. In some embodiments, power converter(s) 111 may also include linear regulators, low drop out regulators (LDOs), or other types of voltage regulators. In any case, power converter(s) 111 may draw power from the battery 103 and convert it to voltage and current levels that are suitable for the various subsystems.

Portable electronic device 101 may also include a charger 105. Charger 105 may be configured to receive power from an external power source 107 and convert it to a suitable voltage and current level for charging battery 103. External power source may be a source of alternating current mains power, an external source of direct current power, an external battery pack, an external fuel cell, an external solar cell, or other power source. Charger 105 may be operated by charger controller 109 to manage the conversion of power received from the external power source to a suitable level for charging the battery. In some embodiments, charger 105 may be integrated with one or more of power converter(s) 111. In other words, charger 105 may be a switching power converter that shares one or more switches as well as one or more energy storage elements, such as capacitors or inductors, with one or more of the power converters that convert the battery power to a suitable voltage and current level for device subsystems 113, 115. Charger controller 109 may monitor one or more battery parameters, including battery voltage, battery current, battery temperature, state of charge, number of charge/discharge cycles, etc. and use the monitored parameters to determine battery charging current and/or voltage as described in greater detail below. In some cases, charger controller 109 may receive the monitored parameters from a battery management system (BMS), colloquially known as a "battery gas gauge." Charger controller 109 may, in some embodiments, communicate with and/or be controlled by one or more device subsystems 115, which may, for example, be a processing subsystem of portable electronic device 101.

Figure 2A:
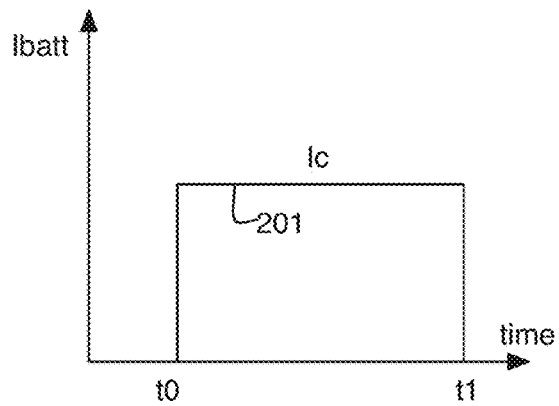
FIGS. 2A-2F depict a series of battery charging currents and voltages.
Figure 2B:
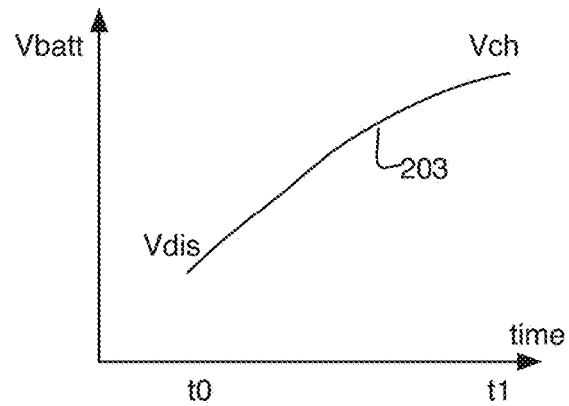

FIGS. 2A-2F illustrate a series of voltage and current curves that correspond to different battery charging profiles. FIG. 2A represents a battery current 201 versus time for a constant current charging cycle, and FIG. 2B represents a corresponding battery voltage curve 203 for the same constant current charging cycle. At time t0, the constant current charging cycle is initiated when battery current 201 goes from zero (or a negative value corresponding to a discharging battery) to a constant battery charging current Ic. The battery charging current 201 returns to zero at time t1, which is the end of the constant current charging cycle. FIG. 2B illustrates the corresponding battery voltage 203. At time t0, the battery voltage is at a relatively low level, Vdis, corresponding to a discharged battery. As the constant charging current Ic is delivered to the battery, the battery voltage increases as depicted by curve 203 until it reaches a relatively higher level, Vch, corresponding to a charged battery. The shape of voltage curve 203 will vary depending on battery chemistry and other properties, but, in general the voltage will increase as the battery charges. The specific values of charging current Ic, discharged voltage Vdis, and charged voltage Vch, will vary depending on the various battery parameters enumerated above, and may be used as target values by the charging controller 109 and battery charger 105.

Figure 2C:
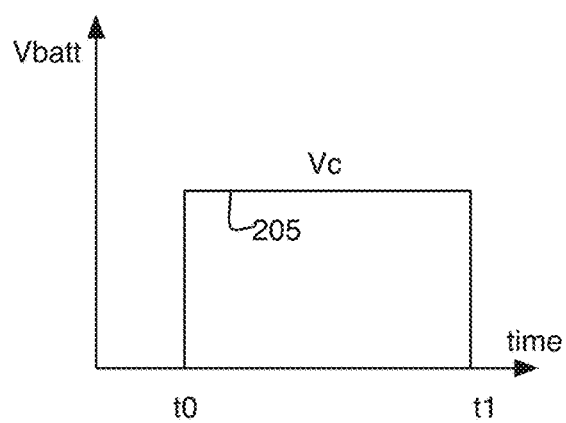
Figure 2D:
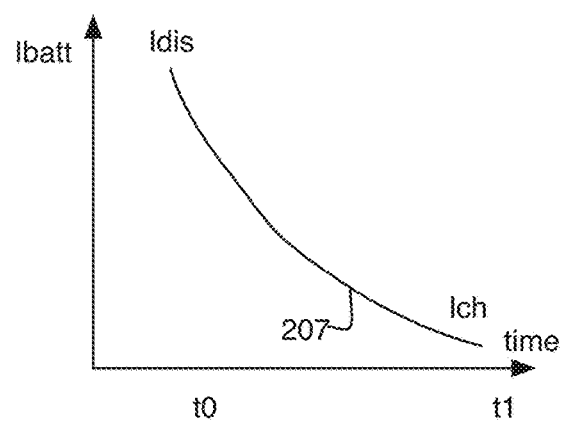

FIG. 2C represents a battery voltage 205 versus time for a constant voltage charging cycle, and FIG. 2D represents a corresponding battery current curve 207 for the same constant voltage charging cycle. At time t0, the constant voltage charging cycle is initiated when charger output voltage 205 goes from zero to a constant battery charging current Vc. It will be appreciated that although the battery charger may not be supplying a voltage prior to time t0, the voltage of the battery is not zero volts, but rather some value Vdis corresponding to a discharged battery. The voltage supplied by the battery charger may be terminated at time t1 when charging is complete (or when the external power source is disconnected). At this point the battery will remain at a voltage corresponding to its state of charge, which may be Vc, assuming that the battery was able to reach a fully charged state before constant voltage charging was terminated.

FIG. 2D illustrates the corresponding battery current 207 for the constant voltage charging cycle. When constant voltage charging is initiated at time t0, the battery current will start out at a relatively high value Idis, corresponding to a discharged battery. As the constant charging voltage Vc is delivered to the battery, the battery current decreases as depicted by curve 207 until it reaches a relatively lower (i.e., near zero) level, Ich, which corresponds to a fully charged battery. The shape of current curve 207 will vary depending on battery chemistry and other properties, but, in general the current will decrease as the battery charges. The specific values of charging voltage Vc, discharged current Idis, and charged current Ich, will vary depending on the various battery parameters enumerated above, and may be used as target values by the charging controller 109 and battery charger 105.

Figure 2E:
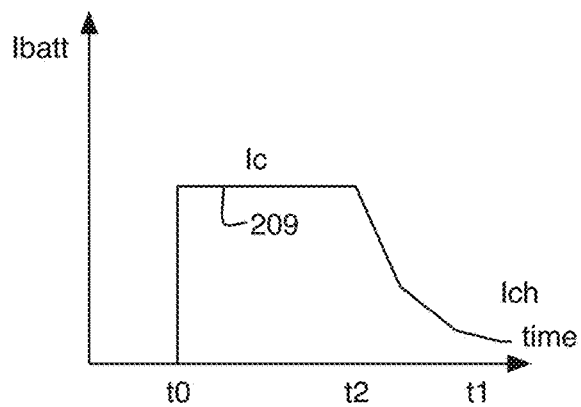
Figure 2F:
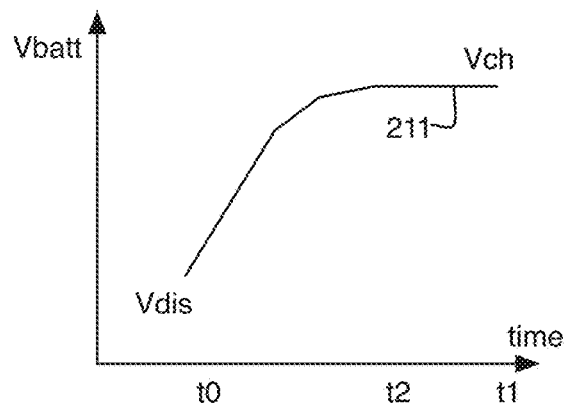

Batteries may be charged using a combined constant current and constant voltage charging cycle. More specifically, a battery may be initially charged to some intermediate charge threshold using a constant current charging technique. Then the battery may be brought to a full charge state (or a second intermediate charge threshold) using a constant voltage charging technique. This process may be repeated until typically there is a final constant voltage charging cycle and the battery is held at a substantially fully charged state. FIGS. 2E and 2F illustrate an exemplary CC-CV (constant current followed by constant voltage) charging cycle. FIG. 2E illustrates the current curve 209. At time t0, the constant charging current Ic is initiated as discussed above with respect to FIG. 2A. At a subsequent time t2, before the battery is completely charged, a constant voltage charging technique is initiated, which results in the battery current decaying to a value Ich at time t1, corresponding to a fully charged battery as discussed above with respect to FIG. 2D. FIG. 2F illustrates the voltage curve 211 for the same cycle. Constant current charging is initiated at time t0, at which time the battery voltage starts out at a relatively lower level Vdis, corresponding to a discharged battery. As the constant charging current is supplied to the battery, the battery voltage increases as described above with respect to FIG. 2B. At time t2, when constant voltage charging is initiated, the battery voltage becomes Vch, and remains at this level until charging is complete at time t1.

Figure 3:
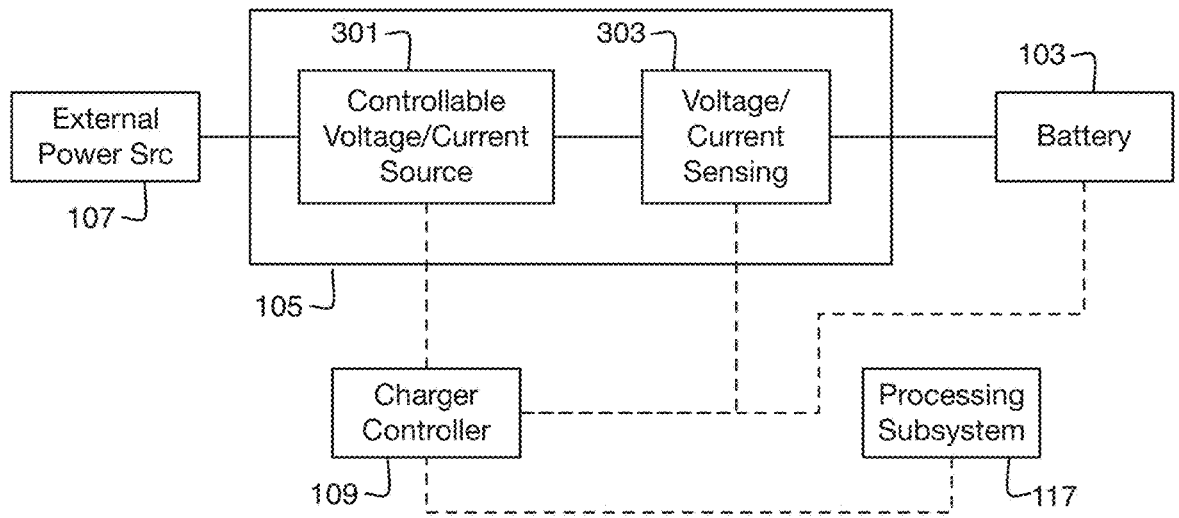
FIG. 3 depicts a charging system of an electronic device.

FIG. 3 illustrates a block diagram of a battery charger 105 that may implement a combined constant current/constant voltage (CC-CV) charging technique. Charger 105 can include a controllable voltage/current source 301. Controllable voltage/current source 301 may be any configuration of circuit or circuits that can produce a desired output current and/or a desired output voltage. As described in greater detail below, controllable voltage/current source may be capable of providing an alternating current signal supplied to the battery. In some embodiments, this AC signal may be superimposed on a DC voltage and/or current supplied to the battery. In other embodiments, this AC signal may be generated by turning the charger on and off while generating a constant (DC) voltage or current. In still other embodiments, the AC signal may be generated by other techniques, such as direct waveform synthesis, for example, depending on the specific circuitry and control capability available. Such circuit or combination of circuits may thus be operated by charger controller 109 to produce the desired current or voltage supplied to the battery 103. As an example, charger controller 109 may be a digital controller that includes one or more registers or other memory locations for storing voltage and/or current settings for controllable voltage/current source 301. These registers may be updated dynamically to provide an AC signal as described in greater detail below.

Charger 105 may also include voltage and/or current sensing modules 303. Voltage/current sensing module 303 may be configured to provide feedback indicating the voltage and/or current supplied to battery 103 by to charger controller 109. Additionally, charger controller 109 may receive battery parameters as enumerated above, which may come from a separate BMS. Finally, as described above charger controller 109 may also have a control and or data feedback connection with processing subsystem 117, which may, for example, be a processing subsystem of portable electronic device 101.

Figure 4:
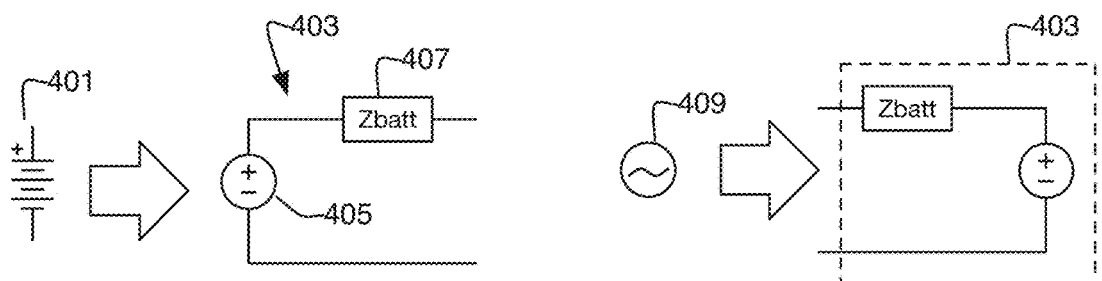
FIG. 4 depicts a battery model and a technique for determining battery impedance corresponding to the battery model.

As illustrated in FIG. 4, a battery 401 may be modeled as a battery model 403. Battery model 403 can include a voltage source 405 and a complex impedance Zbatt (407) in series with the voltage source. Depending on the battery performance region of interest and model accuracy required, Zbatt may range from a simple series resistance to a more complex RC network exhibiting different impedances at different frequencies. In some cases, an RLC network (i.e., a network including one or more resistors, capacitors, and inductors may be used to model battery impedance. Historically, various voltage regulators in the battery system have had sufficiently large inductance that the inductance of the battery was negligible with respect to the remainder of the system. However, newer regulators are operating at higher frequencies, with lower inductance values, and thus lower stored energy. In these cases the inductance of the battery may become significant enough to include in the model.

In any case, a battery model 403 (and thus a real battery) may be characterized by driving the battery terminals with a sinusoidal source 409. In general, sinusoidal source 409 may be a current source or a voltage source. By stimulating the battery with a known AC voltage/current, the resulting current/voltage may be monitored. As a result, Zbatt may be determined as a function of the stimulation and measured response according to Ohm's law. It will be appreciated that the battery impedance Zbatt is not necessarily constant. In fact, Zbatt can vary with temperature, battery age and condition, battery state of charge, etc. As a result, the impedance measurements described herein may be considered snapshots of battery impedance at a given battery temperature, age, condition, state of charge, etc.

By performing such measurements at a variety of frequencies (as well as, over time, a variety of battery temperatures, ages, conditions, states of charge, etc.), a fairly complete picture of battery impedance as a function of frequency may be derived. From this impedance profile, battery performance under a wide variety of conditions may be predicted. In some embodiments, controllable AC source 409 may be integrated with controllable voltage current source 301 of charger 105. As a result, charger controller 109 (optionally in cooperation with processing subsystem 117) may stimulate a battery with one or more suitable AC waveforms (either current or voltage), monitor the result, and build up sufficient data to build an impedance model of the battery. This impedance model may be used to predict the response of battery 103 to various loading conditions and also adjust the performance of portable electronic device 101 to avoid deleterious effects that might be expected under certain conditions.

Figure 5A:
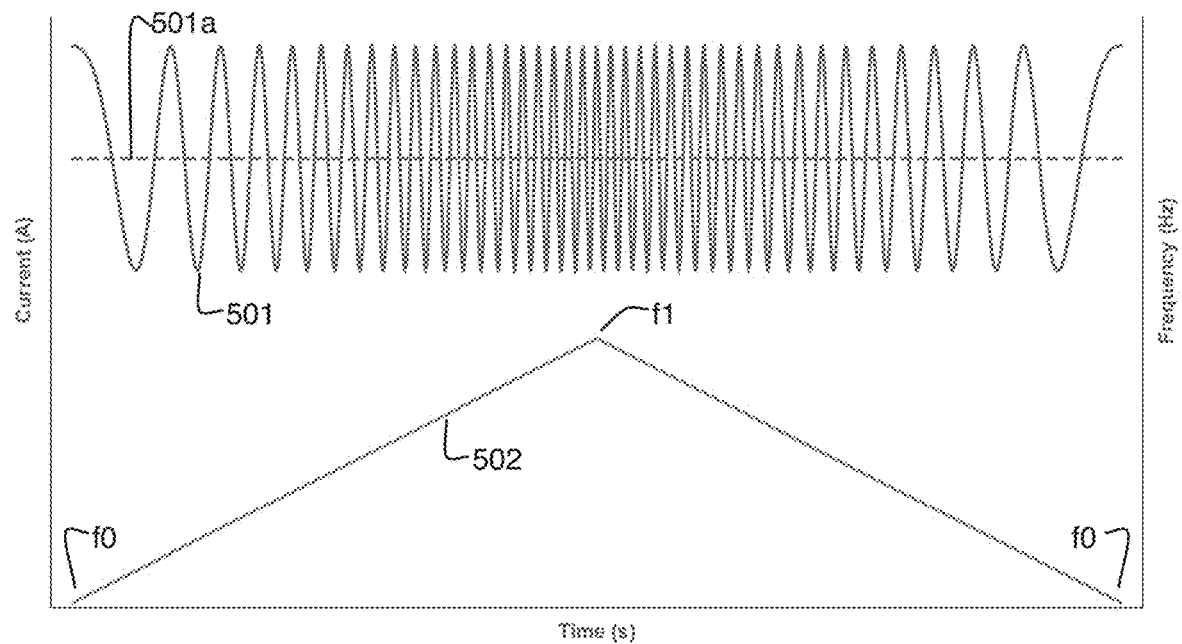
FIGS. 5A-5B depict battery current and voltage curves with an AC signal superimposed thereon.
Figure 5B:
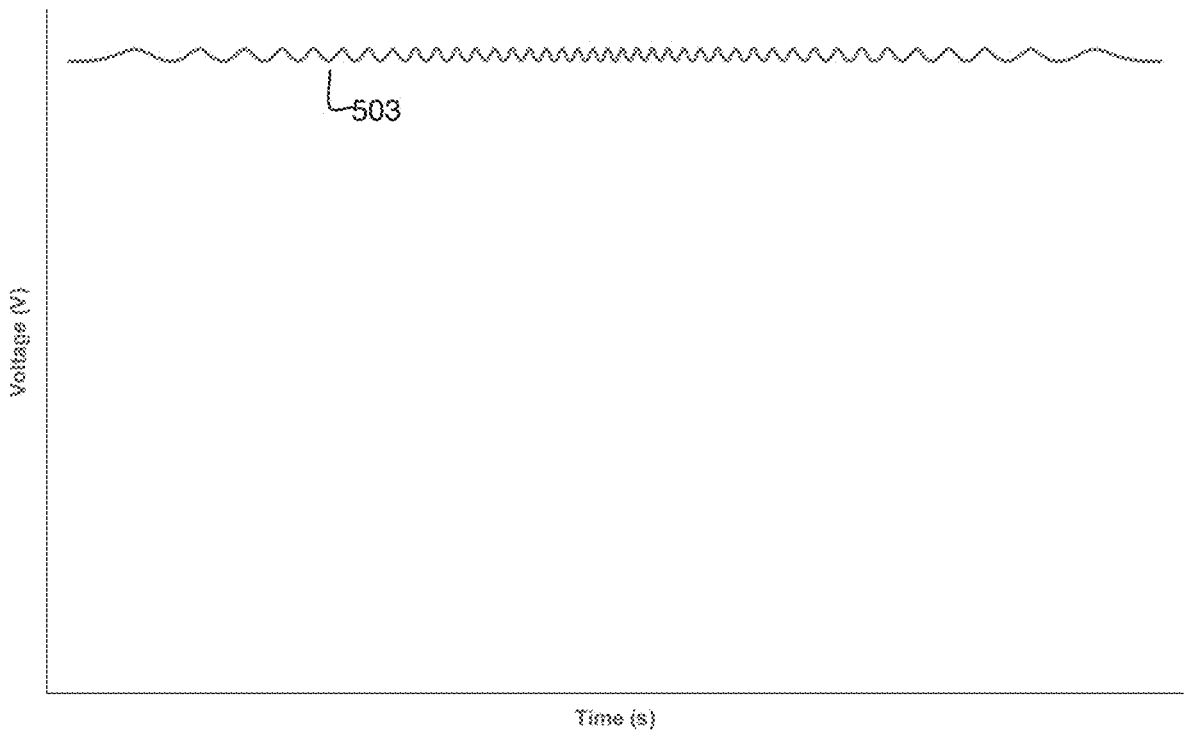

FIGS. 5A and 5B illustrate battery waveforms having a superimposed AC component for measuring battery impedance as described above. (As noted above, the AC signal need not be superimposed on a DC signal, rather this is just one exemplary embodiment.) FIG. 5A illustrates a current 501 that may be supplied to a battery by a charging circuit during a constant current charging phase. It is to be understood that the principles discussed below may be applied to a battery voltage during a constant voltage charging phase as well. Battery current 501 has an average value 501a, which corresponds to the programmed charging current appropriate for a given charging profile. This average value 501a is effectively a DC offset of the supplied current and may be determined according to any of a variety of charging algorithms/controllers. Because this average value is the net charging current set by the charging control algorithm, battery charging time is substantially unaffected by the impedance measurements described herein. Superimposed on the DC portion is an AC signal having a variable frequency as depicted by frequency curve 502. The AC component of current waveform 501 is illustrated as a "chirp" signal, which starts out at a relatively lower frequency f0, increases to a relatively higher peak frequency f1, and then decreases back to the relatively lower initial frequency f0.

The frequencies f0 and f1 may be selected depending on a frequency range of interest for a given battery and portable electronic device application. In some embodiments, f0 may be about 1 Hz, but may be as low as 0.1 Hz. In some embodiments, f1 may be about 10 kHz, but may be as high as 100 kHz. In general other frequency ranges may be used. However, as the frequency decreases below 1 Hz, the response becomes indistinguishable from the DC performance of the battery. Similarly, as the frequency increases much beyond 100 kHz, the measurements become increasingly difficult because of other capacitances in the circuit, etc. Additionally, the Hertz to low kilohertz range provides good coverage over the range in which battery transient performance is most commonly considered for current portable electronic device technologies.

Although depicted as a chirp signal, other types of AC signals may be superimposed on the DC charging current (or otherwise supplied to the battery). For example, a constant frequency AC current (or voltage) may be superimposed on the DC charging current (or voltage). Additionally, a sequence of such constant frequency signals may be sequentially superimposed at different times. In other embodiments, a more complex waveform having a fundamental frequency and one or more harmonics may be employed, although separating the various harmonics in the measured response may be more complicated and may require complex analog filter circuitry or digital signal processing techniques. It bears mentioning that battery impedance Zbatt is not time invariant and varies with respect to temperature, age, condition, state of charge, etc. As a result, the superposition techniques described herein are not necessarily always truly applicable. However, by keeping the measurement intervals relatively short with respect to the time-variation of Zbatt (due to changes in the factors described above), the time variance of Zbatt and memory effects of the battery may be considered as negligible and ignored in computing the impedance curves.

FIG. 5B illustrates a voltage response 503 that a battery may exhibit in response to current 501. Over the relative short time period depicted in FIGS. 5A and 5B, the DC resistance component of the battery impedance is not expected to change significantly. As a result the average value of voltage response 503 has a fairly constant DC offset. Superimposed on top of this DC offset is a sinusoidal chirp signal corresponding to the superimposed AC component of the charging current discussed above. This AC voltage may be used in conjunction with the superimposed AC component of the charging current to determine the battery impedance Zbatt at each frequency of interest according to Ohm's law. More specifically $$Z_{batt}(f) = \frac{V_{batt}(f)}{I_{batt}(f)^*}$$

where Zbatt(f) is the complex impedance of the battery at a frequency f, Vbatt(f) is the AC component of the battery voltage at frequency f, and Ibatt(f) is the AC component of the charging current at frequency f (More specifically, Ibatt(f)* is the complex conjugate of the battery current phasor.)

Figure 5C:
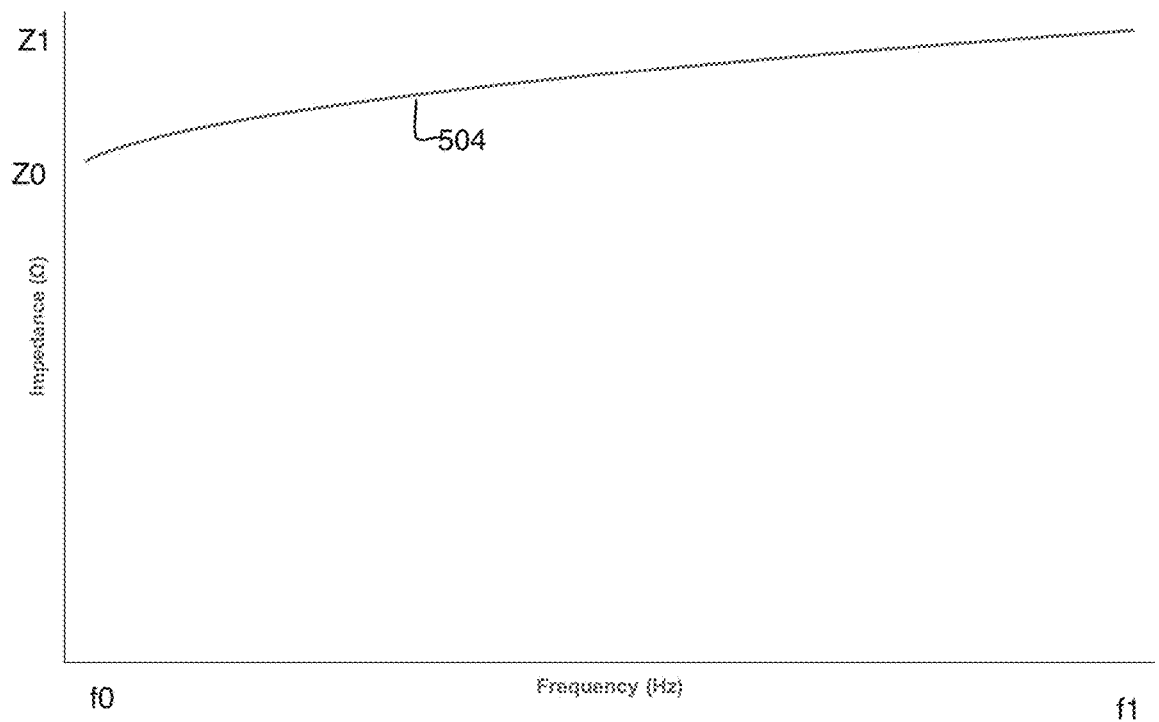
FIG. 5C depicts a battery impedance curve as a function of frequency.

FIG. 5C illustrates an exemplary magnitude of battery impedance 504 as a function of frequency using the current and voltage signals described above with reference to FIGS. 5A and 5B. In the illustrated example, the impedance starts out at a relatively lower value Z0 at lower frequency f0 and increases to a relatively higher value Z1 at higher frequency f1. It will be appreciated that the exact shape of impedance curve 504 and the specific values of Z0 and Z1 will vary depending on the particulars of battery construction, chemistry, condition, age, temperature, etc. Nonetheless, these values may be used by personal electronic device 101 to characterize battery response to various load transients and may also be used to regulate the performance of various subsystems of personal electronic device 101 to prevent brownouts, restarts, or other undesirable operating conditions. It should also be appreciated that although the phase response of the battery impedance has been omitted from FIG. 5C, such phase response may also be taken into account in implementing a system as described herein.

Figure 6:
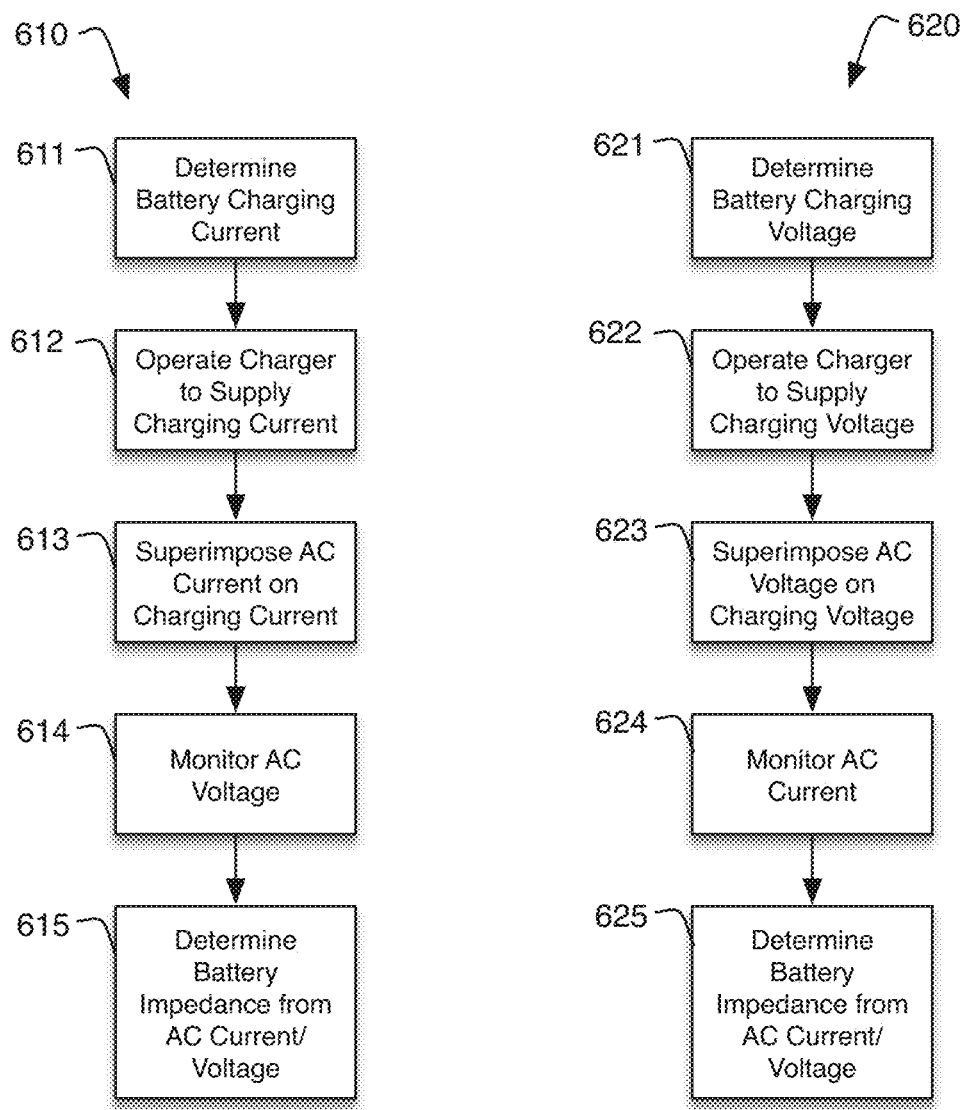
FIG. 6 depicts flowcharts of techniques for measuring battery impedance.

FIG. 6 illustrates two flow charts of methods that may be implemented by charger controller 109, acting either alone or in conjunction with a processing subsystem 117 of portable electronic device 101. Flowchart 610 depicts a technique for determining battery impedance by superimposing an AC current on a charging current supplied to battery 103 and may be used during a constant current charging cycle. Flowchart 620 depicts a technique for determining battery impedance by superimposing an AC voltage on a charging voltage supplied to battery 103 and may be used during a constant voltage charging cycle.

As depicted in flow chart 610, controller 109 may first determine a battery charging current in block 611. The charging current may be determined responsive to battery parameters sensed by controller 109 or provided by a separate battery management system (not shown). Such battery parameters may include voltage, current, temperature, state of charge, number of charge/discharge cycles, battery health, etc. Once controller 109 determines the charging current according to any suitable algorithm or technique, controller 109 may operate battery charger 105 to provide the determined current to the battery 103 (block 612). For all or a portion of the time that controller 109 causes charger 105 to provide the determined charging current to the battery 103, controller 109 may also cause charger 105 to superimpose an AC current on the charging current as described above (block 613). While the AC current is being supplied, controller 109 (or the BMS or processing subsystem 117) may monitor the AC voltage appearing across the battery (block 614). From the known AC current (which may also be monitored by a suitable current sensor (not shown) coupled to either controller 109, the BMS (not shown), or processing subsystem 117), and the monitored AC voltage, the impedance of the battery as a function of frequency may be determined (block 615). This determined battery impedance as a function of frequency may be used in a variety of ways, including as an input into a control algorithm for moderating the performance of portable electronic device to prevent undesirable performance effects caused by exceeding a current that battery 103 can supply while maintaining a suitable output voltage.

As depicted in flow chart 620, controller 109 may first determine a battery charging voltage in block 611. The charging current may be determined responsive to battery parameters sensed by controller 109 or provided by a separate battery management system (not shown). Such battery parameters may include voltage, current, temperature, state of charge, number of charge/discharge cycles, battery health, etc. Once controller 109 determines the charging voltage according to any suitable algorithm or technique, controller 109 may operate battery charger 105 to provide the determined voltage to the battery 103 (block 622). For all or a portion of the time that controller 109 causes charger 105 to provide the determined charging voltage to the battery 103, controller 109 may also cause charger 105 to superimpose an AC voltage on the charging voltage as described above (block 613). While the AC voltage is being supplied, controller 109 (or the BMS or processing subsystem 117) may monitor the AC current into the battery (block 624). From the known AC voltage (which may also be monitored by a suitable voltage sensor (not shown) coupled to either controller 109, the BMS (not shown), or processing subsystem 117), and the monitored AC current, the impedance of the battery as a function of frequency may be determined (block 625). This determined battery impedance as a function of frequency may be used in a variety of ways, including as an input into a control algorithm for moderating the performance of portable electronic device to prevent undesirable performance effects caused by exceeding a current that battery 103 can supply while maintaining a suitable output voltage. Additionally or alternatively, the determined battery impedance may be used as an indicator of battery health and may be provided as an indication of such to a user. For example, the portable electronic device may provide a user interface element that allows a user to check the current health of the battery, or the portable electronic device may provide a warning when the battery health falls below a threshold indicating that battery replacement is warranted.

Figure 7:
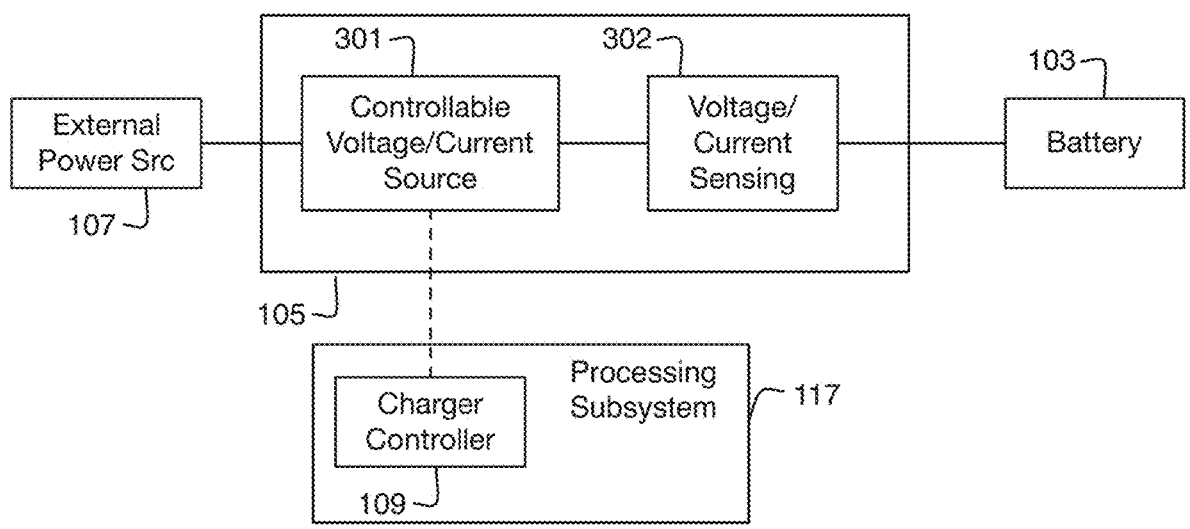
FIG. 7 depicts a charging system of an electronic device.

As described above, charger controller 109 may cooperate with a processing subsystem 117 of portable electronic device 101 to perform the battery impedance determination described herein. FIG. 7 illustrates an arrangement in which charger controller 109 is combined with and/or implemented by a processing subsystem 117 of portable electronic device. The arrangement of FIG. 7 is similar to that of FIG. 3, discussed above, except that charger controller 109 is a part of processing subsystem 117.

With regard to voltage and current sensors 302, these sensors may be AC coupled to controllable voltage/current source 301 and/or battery 103, so that the AC impedance measurements are not affected by the DC charging current/voltage. For example, a voltage sensor for sensing the AC voltage appearing across the battery terminals may be capacitively coupled to the battery. Otherwise, the change in the effective DC resistance of the battery, which can vary as a function of stage of charge, might adversely affect the AC impedance measurements. In other embodiments, rather than AC coupled current/voltage sensing, digital signal processing may be performed by charger controller 109 or processing subsystem 117 (or another component of the system) to isolate the AC measurements from the DC charging voltage/current.

Additional advantages may derive from averaging the above described AC impedance measurements over many measurement cycles or over a significant period of the battery charging time. For example, charger controller 109 may be configured to provide an AC chirp/sweep signal as described above with reference to FIG. 5A at predetermined intervals. The resulting impedance measurements may be stored in a memory associated with charging controller 109 or processing subsystem 117 and averaged over a number of measurement cycles or a specified time duration. This can reduce the effects of various noise sources on the measurements. Further noise mitigation techniques can include configuring processing subsystem 117 to monitor system activity of portable electronic device 101 and only cause the impedance measurements described herein during periods of low system activity. This can prevent the transient voltages/currents associated with various system tasks from interfering with the impedance measurements.

Still other variations and adaptations of the impedance measurement techniques described herein may be applied. For example, the nature of the frequency sweep or "chirp" signal and described above with respect to FIG. 5A associated sampling of voltage/current may be adapted to provide better measurement of the parameters of interest. For example, an exponential variation of sweep frequency (or sampling timing) may allow for the same number of cycles to be measured at each frequency of interest. Alternatively, a linear sweep (or constant sampling timing) may allow for simpler controller design (at the expense of resolution at higher measurement frequencies).

In another variation, rather than superimposing an AC signal (current or voltage) while charging, processing subsystem 117 may cause a known varying AC signal to be superimposed during discharge of the battery. In such cases it may be desirable that such measurements be performed during periods of low system activity to prevent normal system load variation from interfering with the measurements. One way such discharging measurements may be achieved is by varying an operating frequency of a processing subsystem 117 at a frequency of interest, thereby increasing and decreasing the load on battery 103 at the frequency of interest. The associated AC voltage and current appearing across the battery may then be measured and used to determine battery impedance at the frequency of interest.

Described above are various features and embodiments relating to battery impedance measurement. Such battery impedance measurements may be used in a variety of applications but may be particularly advantageous when used to moderate performance of a portable electronic device to prevent brown outs or resets associated with current draw beyond what a battery is capable of providing while maintaining output voltage at a suitable level and/or providing an indication of battery health to a user of the device.

Although numerous specific features and various embodiments have been described, it is to be understood that, unless otherwise noted as being mutually exclusive, the various features and embodiments may be combined in any of the various permutations in a particular implementation. Thus, the various embodiments described above are provided by way of illustration only and should not be constructed to limit the scope of the disclosure. Various modifications and changes can be made to the principles and embodiments herein without departing from the scope of the disclosure and without departing from the scope of the claims.

The invention claimed is:

1. An electronic device comprising:
   a battery;
   a battery charger that receives power from an external power source and supplies at least one of a charging current or a charging voltage to the battery;
   a battery charger controller coupled to charger that:
      controls the charger to deliver a first AC voltage or a first AC current to the battery;
      measures a second AC current caused by the first AC voltage or a second AC voltage caused by the first AC current; and
      determines an impedance of the battery at a frequency of interest from the first AC voltage and the second AC current or the first AC current and the second AC voltage.

2. The electronic device of claim 1 wherein the first AC voltage or first AC current is superimposed on the charging current or the charging voltage supplied by the battery.

3. The electronic device of claim 2 wherein the AC voltage or current superimposed on the charging current or charging voltage is a sinusoidal signal.

4. The electronic device of claim 3 wherein the sinusoidal signal is a variable frequency chirp.

5. The electronic device of claim 2 wherein during at least a portion of a charging cycle the battery charger controller controls the battery charger as a constant voltage charger supplying a constant voltage to the battery.

6. The electronic device of claim 1 wherein the first AC voltage or first AC current is generated by turning the charger on and off at a desired frequency.

7. The electronic device of claim 1 wherein the battery charger controller is controlled by a processing subsystem of the electronic device.

8. The electronic device of claim 1 wherein the battery charger controller is integrated with a processing subsystem of the electronic device.

9. A method of determining impedance of a battery of an electronic device during operation of the electronic device, the method comprising:
   operating a component of the electronic device to generate a first AC voltage or a first AC current as at least part of a battery current or a battery voltage of the electronic device;
   monitoring a second AC current caused by the first AC voltage or a second AC voltage caused by the first AC current; and
   determining an impedance of the battery at a frequency of interest from the first AC voltage and the second AC current or the first AC current and the second AC voltage.

10. The method of claim 9 wherein operating the component of the electronic device to generate the first AC voltage or the first AC current as at least part of the battery current or the battery voltage of the electronic device comprises operating a battery charger to supply the first AC voltage or the first AC current.

11. The method of claim 10 further comprising superimposing the first AC voltage or the first AC current on a charging current or a charging voltage supplied to the battery.

12. The method of claim 11 wherein the first AC voltage or the first AC current is a sinusoidal signal.

13. The method of claim 12 wherein the sinusoidal signal is a variable frequency chirp.

14. The method of claim 9 wherein operating the component of the electronic device to generate the first AC voltage or the first AC current as at least part of the battery current or the battery voltage of the electronic device comprises turning a battery charger of the electronic device on and off at a desired frequency.

15. The method of claim 9 wherein operating the component of the electronic device to generate the first AC voltage or the first AC current as at least part of the battery current or the battery voltage of the electronic device comprises operating a subsystem of the electronic device so as to present a variable load to the battery during discharge of the battery.

16. The method of claim 15 wherein operating the subsystem of the electronic device so as to present a variable load to the battery during discharge of the battery comprises varying an operating frequency of a processing subsystem of the electronic device at a frequency of interest.

17. An electronic device comprising:
   a battery;
   means for generating a first AC voltage or a first AC current as at least part of a battery current or a battery voltage;
   means for monitoring a second AC current caused by the first AC voltage or a second AC voltage caused by the first AC current; and
   means for determining an impedance of the battery at a frequency of interest from the first AC voltage and the second AC current or the first AC current and the second AC voltage.

18. The electronic device of claim 17 wherein the means for generating a first AC voltage or the first AC current as at least part of a battery current or a battery voltage comprises:
   a battery charger including at least one of a controllable voltage source and a controllable current source;
   a battery charger controller coupled to the battery charger that controls the at least one of a controllable voltage source and a controllable current source.

19. The electronic device of claim 17 wherein the means for generating a first AC voltage or a second AC voltage as at least part of a battery current or a battery voltage comprises:
   a subsystem of the electronic device operable to present a variable load to the battery during discharge of the battery.

20. The electronic device of claim 19 wherein the subsystem of the electronic device operable to present a variable load to the battery during discharge of the battery comprises a processing subsystem of the electronic device having its operating frequency varied at a frequency of interest.

21. The electronic device of claim 17 wherein the means for monitoring a second AC current caused by the first AC voltage or a second AC voltage caused by the first AC current comprises at least one of a current sensor or a voltage signal AC coupled to the battery.

22. The electronic device of claim 17 wherein the means for monitoring the second AC current caused by the first AC voltage or the second AC voltage caused by the first AC current comprises a processing subsystem configured to isolate an AC component of at least one of the battery voltage or battery current.

* * * * *